(12) United States Patent
Giancristofaro

(10) Patent No.: US 12,738,909 B2
(45) Date of Patent: Sep. 15, 2026

(54) CURRENT EQUALIZATION CIRCUITRY FOR THE FOLDED BRANCH OF A RAIL-TO-RAIL INPUT OTA WITH AB-CLASS OUTPUT STAGE

(71) Applicant: STMicroelectronics International N.V., Geneva (CH)

(72) Inventor: Lorenzo Giancristofaro, Milan (IT)

(73) Assignee: STMicroelectronics International N.V., Geneva (CH)

( * ) Notice: Subject to any disclaimer, the term of this patent is extended or adjusted under 35 U.S.C. 154(b) by 354 days.

(21) Appl. No.: 18/535,046

(22) Filed: Dec. 11, 2023

(65) Prior Publication Data

US 2025/0192740 A1 Jun. 12, 2025

(51) Int. Cl.
*H03F 3/45* (2006.01)
*H03F 3/21* (2006.01)

(52) U.S. Cl.
CPC ......... *H03F 3/45219* (2013.01); *H03F 3/211* (2013.01); *H03F 2203/45288* (2013.01); *H03F 2203/45541* (2013.01)

(58) Field of Classification Search
CPC ........................................................ H03F 3/45
USPC ........................................ 330/257, 253, 261
See application file for complete search history.

(56) References Cited

U.S. PATENT DOCUMENTS

| | | | |
|---|---|---|---|
| 5,734,297 A | 3/1998 | Huijsing et al. | |
| 8,102,211 B2 | 1/2012 | Shi | |
| 10,536,117 B1 | 1/2020 | Far | |
| 2020/0358406 A1 | 11/2020 | Pandey et al. | |
| 2021/0399723 A1 | 12/2021 | Schubert | |
| 2025/0192740 A1 * | 6/2025 | Giancristofaro | H03F 3/45219 |

* cited by examiner

*Primary Examiner* — Henry Choe
(74) *Attorney, Agent, or Firm* — Crowe & Dunlevy LLC

(57) ABSTRACT

Described herein is an operational transconductance amplifier (OTA) with a constant current source that provides a constant current to a node. The OTA includes two input pairs of transistors: the first sources variable currents based on feedback and input voltages, while the second sinks variable currents also based on feedback and input voltages. A folded cascode arrangement includes two branches, with one branch including a Monticelli cell. A class-AB output stage is present, with its inputs connected across the Monticelli cell. Additionally, a bias stage mirrors and scales the constant current to generate control voltages. Within the folded cascode branches, compensation transistors are controlled by these control voltages, ensuring that various sourced and sunk variable currents are of equal magnitude, making the OTA input voltage independent.

18 Claims, 5 Drawing Sheets

CURRENT EQUALIZATION CIRCUITRY FOR THE FOLDED BRANCH OF A RAIL-TO-RAIL INPUT OTA WITH AB-CLASS OUTPUT STAGE

TECHNICAL FIELD

This disclosure relates generally to operational transconductance amplifiers (OTAs), and in particular, to circuitry designed for achieving current equalization in the folded cascode branch of a Rail-To-Rail input OTA with an AB-class output stage.

BACKGROUND

Operational Transconductance Amplifiers (OTAs) are fundamental building blocks in analog integrated circuit design. Their ability to convert a differential voltage input into a current output makes them pivotal in various applications, such as filters, oscillators, and analog signal processing chains. A Rail-To-Rail input capability in an OTA ensures that the amplifier can handle input signals that span the entire power supply range (e.g., 0 to VDD), thereby providing greater flexibility in design and broader applicability.

One of the popular topologies adopted in OTA design for achieving Rail-To-Rail input capability is the folded cascode configuration. The folded cascode OTA offers advantages like improved linearity, increased output resistance, and better swing capabilities compared to basic OTA structures. However, as input voltages approach the rail limits, discrepancies in current distribution within the folded cascode branch can arise. These discrepancies can lead to nonlinearities, offset voltages, and other undesired anomalies in the amplifier's behavior.

A known OTA 10 is now described with reference to FIG. 1. The OTA 10 includes a p-channel transistor M1 having its source connected to supply node VDD, its drain connected to node N1, and its gate coupled to control signal ppol. In the OTA 10 described below, note that the voltages ppol, npol, ncasc, and pcasc are generated externally to the OTA 10 and are generally available in a system integrating such an OTA.

A first input pair 13 is formed by: p-channel transistor MP0 having its source connected to node N1, its drain connected to node C, and its gate coupled to feedback voltage VFB; and p-channel transistor MP1 having its source connected to node N1, its drain connected to node D, and its gate coupled to input voltage VIN. For the sake of simplicity, the condition of VIN being nearly equal to VFB will apply from now on, as this OTA is commonly used in a closed loop system.

A second input pair 14 is formed by: n-channel transistor MN0 having its drain connected to node A, its source connected to node N2, and its gate coupled to feedback voltage VFB; and n-channel transistor MN1 having its drain connected to node B, its source connected to node N2, and its gate coupled to input voltage VIN.

A current mirror is formed by: n-channel transistor M5 having its drain connected to node N2, its source connected to ground, and its gate connected to node N3 and receiving tail voltage ntail; and n-channel transistor M4 having its drain and gate connected to node N3, and its source connected to ground.

A current splitting structure 12 is formed by: p-channel transistor M3 having its source connected to node N1, its drain connected to node N3, and its gate connected to node N4; p-channel transistor M2 having its source connected to supply node VDD, its drain connected to node N4, and its gate connected to node N4; and n-channel transistor MC0 having its drain connected to node N4, its source connected to ground, and its gate connected to control signal npol.

A folded cascode 17 is formed by: p-channel transistor M6 having its source connected to the supply node VDD, its drain connected to node A, and its gate coupled to control signal ppol; p-channel transistor M8 having its source connected to node A, its drain connected to node N5, and its gate connected to the gate of p-channel transistor M9 as well as control signal pcasc; n-channel transistor M13 having its drain connected to node N5, its source connected to node C, and its gate connected to the gate of n-channel transistor M12 as well as control signal ncasc; n-channel transistor M14 having its drain connected to node C, its source connected to ground, and its gate connected to node N5; p-channel transistor M7 having its source connected to the supply node VDD, its drain connected to node B, and its gate connected to control signal ppol; p-channel transistor M9 having its source connected to node B, its drain connected to node N6, and its gate connected to control signal pcasc; n-channel transistor M12 having its drain connected to node N6, its source connected to node D, and its gate connected to the gate of n-channel transistor M13 as well as to control signal ncasc; and n-channel transistor M15 having its drain connected to node D, its source connected to ground, and its gate connected to node N5.

A class-AB output stage 19 is formed by: p-channel transistor M16 having its source connected to supply node VDD, its drain connected to the source of p-channel transistor M17, and its gate connected to the gate of p-channel transistor M7 as well as control signal ppol; p-channel transistor M17 having its source connected to the drain of p-channel transistor M16, its drain connected to node N7, and its gate coupled to control signal pcasc; and a Monticelli cell 18. The Monticelli cell 18 is formed by: n-channel transistor M11 having its drain connected to node N7, its source connected to node N6, and its gate coupled to node H; and p-channel transistor M10 having its source connected to node N7, its drain connected to node N6, and its gate coupled to node J.

The class-AB output stage 19 further includes: n-channel transistor M18 having its drain connected to node N6, its source connected to the drain of n-channel transistor M19, and its gate coupled to control signal ncasc; n-channel transistor M19 having its drain connected to the source of n-channel transistor M18, and its source connected to ground, and its gate coupled to control signal npol; p-channel transistor M21 having its source connected to the supply node VDD, its drain connected to node NO, and its gate connected to node N7; n-channel transistor M20 having its drain connected to node NO, its source connected to ground, and its gate connected to node N6; p-channel transistor M34 having its source connected to VDD, its drain connected to node H, and its gate coupled to control signal ppol; n-channel transistor M32 having its drain and its gate connected to node H and its source connected to the gate and drain of n-channel transistor M31; n-channel transistor M31 having its drain and gate connected to the source of n-channel transistor M32 and its source connected to ground; p-channel transistor M35 in a diode coupled configuration with its source connected to VDD and its gate and drain connected to the source of p-channel transistor M36; p-channel transistor M36 in a diode coupled configuration with its source connected to the gate and drain of p-channel transistor M35 and its drain and gate connected to node J; and n-channel transistor M33 having its drain connected to node J and its source connected to ground, with the gate of M33 being coupled to control signal npol.

A capacitor C2 is connected between node NO and ground, and the output voltage Vout is formed across capacitor C2. Resistor R0 and capacitor C0 are connected in series between node N7 and node NO. Resistor R1 and capacitor C1 are connected in series between node N6 and node NO.

In operation, the voltage VIN is the non-inverting input to the OTA 10 (e.g., the gates of transistors MP1 and MN1) and the feedback voltage VFB is the inverting input to the OTA 10 (e.g., the gates of transistors MP0 and MN0). P-channel transistor M1 is controlled via control signal ppol so that a constant current having a magnitude of $2I_{TI}$ is sourced to node N1.

The control signal npol is such that a constant current is sunk from N4 by MC0 and sourced by M2, defining the voltage of the node N4. M3 splits the current $2I_{TI}$ sourced by M1 from node N1 into $2(I_{TI}-x)$ and 2x. The fraction $2(I_{TI}-x)$ is further split into equal fractions of magnitude, namely $I_{TI}-x$ flowing through MP0 and $I_{TI}-x$ flowing through MP1. The current fraction 2x flows through M3 and is mirrored by M4 to M5 until it flows through MN0 and MN1. In greater detail, transistor MC0 is a tail generator that sinks a current that is read by transistor M2. This arrangement generates a voltage on the node N4 that is used to control the gate of transistor M3. Consider the situation where VIN is close to ground; in this situation, $2I_{TI}$ will flow into transistors MP0 and MP1, so node N1 will follow VIN and the voltage at node N1 will be low enough to force transistor M3 to turn off so that 2x=0, with transistors MN0 and MN1 also being off in this condition. Consider now the situation where VIN is close to VDD; in this situation, $2I_{TI}$ will flow into transistor M1, node N1 will follow the voltage at node N4 and the voltage at node N1 will be low enough to force transistors MP0 and MP1 to turn off, such that $2I_{TI}$ will flow through transistor M3 and will be mirrored by M4:M5 into MN0:MN1 so that $2x=2I_{TI}$, with transistors MN0 and MN1 being on in this condition. Transistors MC0 and M2 are sized in such a way that transistor M3 can sink the current generated by transistor M1 such that it is substantially routed around transistor MP0 and MP1, if VIN is close to VDD.

Keeping this in mind, the arrangement of n-channel transistor MC0, structure M2:M3 and current mirror M4:M5 allows for discrimination of where the current having a magnitude of $2I_{TI}$ sourced to node N1 by p-channel transistor M1 will flow. If VIN is sufficiently low, this current flows into the input pair 13, and if VIN is sufficiently high, this current flows into the input pair 14. If VIN is somewhere in the middle between the low value and the high value, the current $2I_{TI}$ is split into two parts ($2I_{TI}$-2x and 2x), in which 2x can be larger or smaller depending on VIN.

For example, as VIN decreases and approaches 0, the value of x approaches 0, mathematically represented as:

$$\lim_{VIN \to 0} x = 0$$

With VIN being 0, a current having a magnitude of $I_{TI}$ therefore flows into each of p-channel transistor MP0 and p-channel transistor MP1, with substantially no current flowing through M3 and the current mirror M4:M5.

Conversely, as VIN increases and approaches VDD, the value of x approaches $I_{TI}$, mathematically represented as:

$$\lim_{VIN \to VDD} x = I_{TI}$$

With VIN being VDD, a current having a magnitude of $I_{TI}$ therefore flows into each of n-channel transistor MN0 and MN1, with substantially no current flowing into p-channel transistors MP0 and MP1.

As a result of this current steering arrangement, the transconductance of the OTA 10 is, at first order, independent of the input voltage.

In the folded cascode 17, p-channel transistor M6, controlled via control signal ppol, sources a current having a magnitude of $I_{TF}$ to node A, but recall that n-channel transistor MN0 sinks a current having a magnitude of x from node A such that the current sourced by p-channel transistor M8 to node N5 has a magnitude of $I_{TF}-x$. Similarly, p-channel transistor M7, controlled via control signal ppol, sources a current having a magnitude of $I_{TF}$ to node B, but recall that n-channel transistor MN1 sinks a current having a magnitude of x from node B such that the current sourced by p-channel transistor M9 to node N6 has a magnitude of $I_{TF}-x$. N-channel transistor M13, controlled via control signal ncasc, in turn sources a current having a magnitude of $I_{TF}-x$ to node C and likewise n-channel transistor M12, controlled via control signal ncasc, sources a current having a magnitude of $I_{TF}-x$ to node D.

Since n-channel transistor M13 sources a current having a magnitude of $I_{TF}-x$ to node C and since p-channel transistor MP0 sources a current having a magnitude of $I_{TI}-x$ to node C, the magnitude of the current through n-channel transistor M14 is $I_{TF}+I_{TI}-2x$. Similarly, since n-channel transistor M12 sources a current having a magnitude of $I_{TF}-x$ to node D and since p-channel transistor MP1 sources a current having a magnitude of $I_{TI}-x$ to node D, the magnitude of the current through n-channel transistor M15 is $I_{TF}+I_{TI}-2x$.

Regarding operation of the folded cascode 17, consider first the case of the value of VIN being 0. Here, a current with a magnitude of $I_{TF}$ is sourced by n-channel transistor M13 to node C, a current with a magnitude of $I_{TF}$ is sourced by n-channel transistor M12 to node D, a current with a magnitude of $I_{TI}$ is sourced by p-channel transistor MP0 to node C, and a current with a magnitude of $I_{TI}$ is sourced by p-channel transistor MP1 to node D. As a consequence, the current sunk from node C by n-channel transistor M14 is $I_{TF}+I_{TI}$ and the current sunk from node D by n-channel transistor M15 is $I_{TF}+I_{TI}$.

However, now consider the case of the value of VIN being VDD. Here, a current with a magnitude of $I_{TF}-I_{TI}$ is sourced by n-channel transistor M13 to node C, a current with a magnitude of $I_{TF}-I_{TI}$ is sourced by n-channel transistor M12 to node D, p-channel transistor MP0 sources no current to node C and p-channel transistor MP1 sources no current to node D. As a consequence, the current sunk from node C by n-channel transistor M14 is $I_{TF}-I_{TI}$ and the current sunk from node D by n-channel transistor M15 is $I_{TF}-I_{TI}$.

Thus, the bias current of the folded cascode 17 is input dependent, which is undesirable as there may be some poles and zeroes (in general, some singularities) at high frequencies that can shift undesirably with input, making the dynamic response of the OTA input dependent. In addition, the transconductance of the current mirror M14:M15 is input dependent, leading to an input dependent input referred M14:M15 mirror noise contributions. Stated differently, in terms of noise and singularities (e.g., poles and zeros), it is as if the OTA 10 were three different OTAs, dependent upon whether the input voltage is close to VDD, close to ground, or somewhere in the middle between VDD and ground.

In the output stage 19, the Monticelli cell 18 dynamically generates a quiescent bias voltage at nodes N7 and N6 to control the bias current of M21 and M20, providing for low crossover distortion by keeping output transistors M21 and M20 slightly on in the absence of an input signal. As input signal amplitude rises, the Monticelli cell 18 modulates the gate voltages of these output transistors M21 and M20, providing adaptive drive capability. This provides for balanced operation between the push transistor M21 and pull transistor M20, equalizing their contributions during transitions. The Monticelli cell 18 provides for thermal stability, dynamically adjusting biasing with temperature variations. This results in a Class-AB output at output node NO that balances efficiency with linearity.

Notice here how the Monticelli cell 18 is positioned within a separate branch apart from the folded cascode 17, as the Monticelli cell utilizes a constant current for operation, and as explained, the folded cascode 17 does not provide a constant current. This use of a separate branch consumes area and adds complexity to the OTA design 10.

Given the above-described drawbacks with the folded cascode 17, and the resulting drawback in biasing the Monticelli cell 18, further development into the area of OTAs is needed.

SUMMARY

Disclosed herein is an operational transconductance amplifier (OTA) including a constant current source configured to source a first constant current to a first node and a first input pair of transistors. The first input pair of transistors includes a first input transistor coupled between the first node and a third folded branch node, the first input transistor configured to source a first variable current to the third folded branch node based upon a feedback voltage, and a second input transistor coupled between the first node and a fourth folded branch node, the second input transistor configured to source a second variable current to the fourth folded branch node based upon an input voltage. A tail current source sinks a tail current from a second node.

A second input pair of transistors includes a third input transistor coupled between a first folded branch node and the second node, the third input transistor configured to sink a third variable current from the first folded branch node based upon the feedback voltage, and a fourth input transistor coupled between a second folded branch node and the second node, the fourth input transistor configured to sink a fourth variable current from the second folded branch node based upon the input voltage.

A folded cascode arrangement includes a first folded cascode branch coupled to the first folded branch node and the third folded branch node and a second folded cascode branch coupled to the second folded branch node and the fourth folded branch node, wherein the second folded cascode branch includes a Monticelli cell coupled between the second folded branch node and the fourth folded branch node. A class-AB output stage has inputs coupled across the Monticelli cell;

A bias stage is configured to mirror and scale the first constant current and the tail current to produce first and second control voltages.

The folded cascode arrangement includes, within the first folded cascode branch, a first tail generator transistor controlled by the first control voltage to source a fifth variable current to the first folded branch node, the fifth variable current being equal in magnitude to the third variable current, and a second tail generator transistor controlled by the second control voltage to sink a sixth variable current from the third folded branch node, the sixth variable current being equal in magnitude to the first variable current.

The folded cascode arrangement includes, within the second folded cascode branch, a third tail generator transistor controlled by the first control voltage to source a seventh variable current to the second folded branch node, the seventh variable current being equal in magnitude to the fourth variable current, and a fourth tail generator transistor controlled by the second control voltage to sink an eighth variable current from the fourth folded branch node, the eighth variable current being equal in magnitude to the second variable current.

The tail current source may be a current mirror having a control node receiving a first control signal. The constant current source may have a control terminal receiving a second control signal.

The bias stage may include a first bias transistor connected in a diode coupled arrangement between a supply voltage node and a first compensation node, a second bias transistor connected between the first compensation node and ground, with a control terminal of the second bias transistor being connected to a control node of the current mirror, a third bias transistor connected between the supply voltage node and a second compensation node, with a control terminal of the third bias transistor coupled to the second control signal, a fourth bias transistor connected between the second compensation node and ground, with a control terminal of the fourth bias transistor coupled to the first control signal, and a fifth bias transistor connected in a diode coupled arrangement between the second compensation node and ground.

The constant current source may have a control terminal receiving a second control signal.

The folded cascode arrangement may further include, within the first folded cascode branch, a fifth tail generator transistor connected between a supply voltage node and the first folded branch node, the fifth tail generator transistor having a control terminal coupled to the second control signal, a first cascode transistor connected between the first folded branch node and a third cascode transistor, the first cascode transistor having a control terminal coupled to a first cascode control signal, the second cascode transistor connected between the first cascode transistor and a third cascode transistor, the second cascode transistor having a control terminal coupled to a third cascode control signal, the third cascode transistor connected between the second cascode transistor and the third folded branch node, the third cascode transistor having a control terminal coupled to a second cascode control signal, and a sixth tail generator transistor connected between the third folded branch node and ground, the sixth tail generator transistor having a control terminal coupled to a node between the second cascode transistor and the third cascode transistor.

The folded cascode arrangement may further include, within the second folded cascode branch a seventh tail generator transistor connected between the supply voltage node and the second folded branch node, the seventh tail generator transistor having a control terminal coupled to the second control signal, a fourth cascode transistor connected between the second folded branch node and the Monticelli cell, the fourth cascode transistor having a control terminal coupled to the first cascode control signal, a fifth cascode transistor connected between the Monticelli cell and the fourth folded branch node, the fifth cascode transistor having a control terminal coupled to the second cascode control signal, and an eighth tail generator transistor connected between the fourth folded branch node and ground, the eighth tail generator transistor having a control terminal coupled to the node between the second cascode transistor and the third cascode transistor.

The first folded branch node may be connected to the source of the first cascode transistor, and the second folded branch node may be connected to the source of the fourth cascode transistor.

The folded cascode arrangement may also include a first chopper having first and second inputs and first and second outputs, the first chopper configured to chop voltages at the first and second inputs of the first chopper, the first output of the first chopper being connected to the drain of the first cascode transistor, the second output of the first chopper being connected to the drain of the fourth cascode transistor.

The fifth tail generator transistor may have a first conduction terminal connected to a supply voltage node and a second conduction terminal connected to the first input of the first chopper. The first tail generator transistor may have a first conduction terminal connected to the supply voltage node and a second conduction terminal connected to the first input of the first chopper. The seventh tail generator transistor may have a first conduction terminal connected to the supply voltage node and a second conduction terminal connected to the second input of the first chopper. The third tail generator transistor may have a first conduction terminal connected to the supply voltage node and a second conduction terminal connected to the second input of the first chopper.

The third folded branch node (C) may be connected to the source of the third cascode transistor (M13), and the fourth folded branch node (D) may be connected to the source of the fifth cascode transistor (M13).

The folded cascode arrangement may also include a second chopper having first and second inputs and first and second outputs, the second chopper configured to chop voltages at the first and second inputs of the second chopper, the first output of the second chopper being connected to the drains of the sixth tail generator transistor and the second tail generator transistor, the second output of the second chopper being connected to the drains of the eighth tail generator transistor (M15) and the fourth tail generator transistor.

The third cascode transistor may have a first conduction terminal connected to the second cascode transistor and a second conduction terminal connected to the first input of the second chopper. The fifth cascode transistor may have a first conduction terminal connected to the Monticelli cell and a second conduction terminal connected to the second input of the second chopper.

The folded cascode arrangement may further include a first chopper having first and second inputs and first and second outputs, the first chopper configured to chop voltages at the first and second inputs of the first chopper, the first output of the first chopper being connected to the drain of the first cascode transistor, the second output of the first chopper being connected to the fourth cascode transistor.

The fifth tail generator transistor may have a first conduction terminal connected to a supply voltage node and a second conduction terminal connected to the first input of the first chopper. The first tail generator transistor may have a first conduction terminal connected to the supply voltage node and a second conduction terminal connected to the first input of the first chopper. The seventh tail generator transistor may have a first conduction terminal connected to the supply voltage node and a second conduction terminal connected to the second input of the first chopper.

The third tail generator transistor may have a first conduction terminal connected to the supply voltage node and a second conduction terminal connected to the second input of the first chopper. The folded cascode arrangement may also include a second chopper having first and second inputs and first and second outputs, the second chopper configured to chop voltages at the first and second inputs of the second chopper, the first output of the second chopper being connected to the drains of the sixth tail generator transistor and the second tail generator transistor, the second output of the second chopper being connected to the drains of the eighth tail generator transistor and the fourth tail generator transistor.

The third cascode transistor may have a first conduction terminal connected to the second cascode transistor and a second conduction terminal connected to the first input of the second chopper. The fifth cascode transistor may have a first conduction terminal connected to the Monticelli cell and a second conduction terminal connected to the second input of the second chopper.

A third chopper may be configured to chop the feedback voltage and the input voltage, provide the chopped feedback voltage to control terminals of the first input transistor and third input transistor, and provide the chopped input voltage to control terminals of the second input transistor and fourth input transistor.

The constant current source may have a control terminal receiving a second control signal. The class-AB output stage may include a first input coupled to a first output terminal of the Monticelli cell, a second input coupled to a second output terminal of the Monticelli cell, a first output transistor connected between a supply node and an output node, the first output transistor having a control terminal connected to the first input, a second output transistor connected between the output node and ground, the second output transistor having a control terminal connected to the second input, a third output transistor connected between the supply node and a fourth output transistor, the third output transistor having a control terminal connected to the second control signal, the fourth output transistor connected in a diode coupled configuration between the third output transistor and a first input of the Monticelli cell, a fifth output transistor connected in a diode coupled configuration between the fourth output transistor and ground, a sixth output transistor connected in a diode coupled configuration between the supply node and a seventh output transistor, the seventh output transistor connected in a diode coupled configuration between the sixth output transistor and a second input of the Monticelli cell, and an eighth output transistor connected between the second input of the Monticelli cell and ground.

The Monticelli cell may include a first transistor connected between the first output terminal and the second output terminal, wherein the first transistor has a control terminal connected to a control terminal of the fourth output transistor, and a second transistor connected between the first output terminal and the second output terminal, wherein the second transistor has a control terminal connected to a control terminal of the seventh output transistor.

The class-AB output stage may include a first resistor and first capacitor connected in series between the first output terminal of the Monticelli cell and the output node, and a second resistor and second capacitor connected in series between the second output terminal of the Monticelli cell and the output node.

The class-AB output stage may include a first capacitor connected in series between the second folded branch node and the output node, and a second capacitor connected in series between the fourth folded branch node and the output node.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following description, any resistor or resistance mentioned is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

Figure 2:
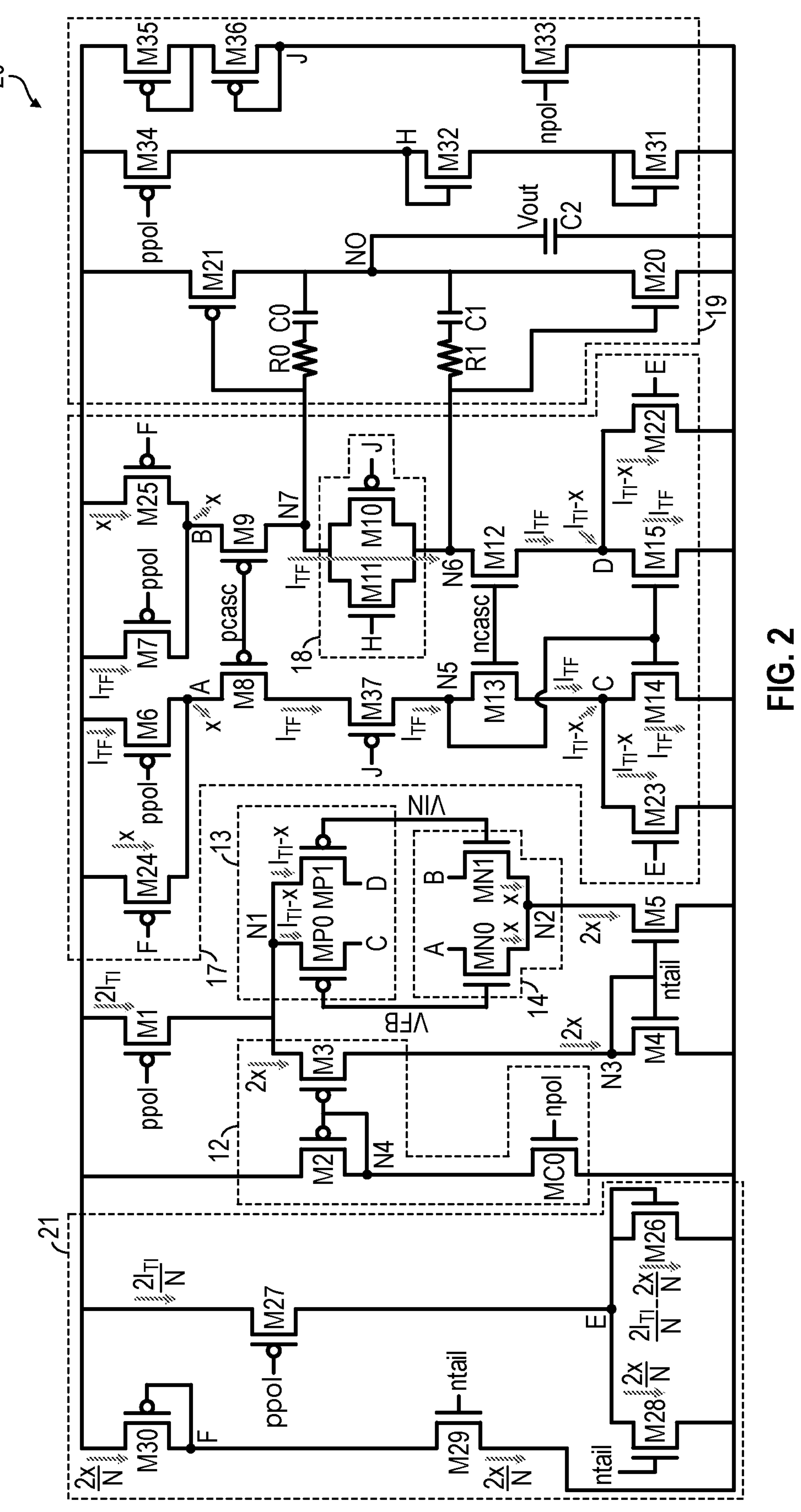
FIG. 2 is a schematic diagram of a first embodiment of an OTA disclosed herein.

An improved OTA 20 having a folded cascode configuration is now described with reference to FIG. 2. The OTA 20 includes a p-channel transistor M1 having its source connected to supply node VDD, its drain connected to node N1, and its gate coupled to control signal ppol.

A first input pair 13 is formed by: p-channel transistor MP0 having its source connected to node N1, its drain connected to node C, and its gate coupled to feedback voltage VFB; and p-channel transistor MP1 having its source connected to node N1, its drain connected to node D, and its gate coupled to input voltage VIN. For the sake of simplicity, the condition of VIN being nearly equal to VFB will apply from now on, as this OTA is commonly used in a closed loop system.

A second input pair 14 is formed by: n-channel transistor MN0 having its drain connected to node A, its source connected to node N2, and its gate coupled to feedback voltage VFB; and n-channel transistor MN1 having its drain connected to node B, its source connected to node N2, and its gate coupled to input voltage VIN.

A current mirror is formed by: n-channel transistor M5 having its drain connected to node N2, its source connected to ground, and its gate connected to node N3 and receiving tail voltage ntail; and n-channel transistor M4 having its drain and gate connected to node ntail and its source connected to ground.

A current splitting structure 12 is formed by: p-channel transistor M3 having its source connected to node N1, its drain connected to node N3, and its gate connected to node N4; p-channel transistor M2 having its source connected to supply node VDD, its drain connected to node N4, and its gate connected to node N4; and n-channel transistor MC0 having its drain connected to node N4, its source connected to ground, and its gate connected to control signal npol.

A bias stage 21 includes: p-channel transistor M30 having its source connected to the supply node VDD and its drain and gate connected to node F; n-channel transistor M29 having its drain connected to node F, its source connected to ground, and its gate coupled to the control voltage ntail; p-channel transistor M27 having its source connected to the supply node VDD, its drain connected to node E, and its gate coupled to the control voltage ppol; n-channel transistor M28 having its drain connected to node E, its source connected to ground, and its gate coupled to the control voltage ntail; and n-channel transistor M26 being diode coupled between node E and ground, with its drain and gate connected to node E and its source connected to ground.

A folded cascode 17 is formed by: p-channel transistor M6 having its source connected to the supply node VDD, its drain connected to node A, and its gate coupled to control signal ppol; p-channel transistor M24 having its source connected to supply node VDD, its drain connected to node A, and its gate coupled to node F; p-channel transistor M8 having its source connected to node A, its drain connected to the source of p-channel transistor M37, and its gate connected to the gate of p-channel transistor M9 as well as control signal pcasc; p-channel transistor M37 having its source connected to the drain of p-channel transistor M8, its drain connected to node N5, and its gate connected to node J; n-channel transistor M13 having its drain connected to node N5, its source connected to node C, and its gate connected to the gate of n-channel transistor M12 as well as control signal ncasc; n-channel transistor M14 having its drain connected to node C, its source connected to ground, and its gate connected to node N5; n-channel transistor M23 having its drain connected to node C, its source connected to ground, and its gate connected to node E; p-channel transistor M7 having its source connected to the supply node VDD, its drain connected to node B, and its gate connected to the control signal ppol; p-channel transistor M25 having its source connected to the supply node VDD, its drain connected to node B, and its gate coupled to node F; and p-channel transistor M9 having its source connected to node B, its drain connected to node N7, and its gate connected to the gate of p-channel transistor M8 as well as to control signal pcasc.

The folded cascode 17 also includes a Monticelli cell 18 formed by: n-channel transistor M11 having its drain connected to node N7, its source connected to node N6, and its gate coupled to node H; and p-channel transistor M10 having its source connected to node N7, its drain connected to node N6, and its gate coupled to node J.

The folded cascode 17 further includes: n-channel transistor M12 having its drain connected to node N6, its source connected to node D, and its gate connected to the gate of n-channel transistor M13 as well as to control signal ncasc; n-channel transistor M15 having its drain connected to node D, its source connected to ground, and its gate connected to node N5; and n-channel transistor M22 having its drain connected to node D, its source connected to ground, and its gate coupled to node E.

The class-AB output stage 19 includes: p-channel transistor M21 having its source connected to supply node VDD, its drain connected to node NO, and its gate connected to the node N7; n-channel transistor M20 having its drain connected to node NO, its source connected to ground, and its gate connected to node N6; p-channel transistor M34 having its source connected to the supply voltage VDD, its drain connected to node H, and its gate coupled to the control signal ppol; n-channel transistor M32 being diode coupled, with its drain and gate connected to node H and its source connected to the drain and gate of n-channel transistor M31; n-channel transistor M31 being diode coupled, with its drain and gate connected to the source of n-channel transistor M32 and its source connected to ground; p-channel transistor M35 being diode coupled, with its source connected to the supply voltage VDD and its drain and gate connected to the source of p-channel transistor M36; p-channel transistor M36 being diode coupled, with its source connected to the drain and gate of transistor M35 and its drain and gate connected to node J; and n-channel transistor M33 having its drain connected to node J, its source connected to ground, and its gate coupled to control voltage npol.

Resistor R0 and capacitor C0 are connected in series between node N7 and node N0. Resistor R1 and capacitor C1 are connected in series between node N6 and node N0.

Operation is now described. In operation, the voltage VIN is at the non-inverting input to the OTA 20 (e.g., the gates of transistors MP1 and MN1) and the feedback voltage VFB is at the inverting input to the OTA 20 (e.g., the gates of transistors MP0 and MN0). P-channel transistor M1 is controlled via control signal ppol so that a constant current having a magnitude of $2I_{TI}$ is sourced to node N1.

The control signal npol is such that a constant current is sunk from N4 and sourced by M2, defining the voltage of the node N4. M3 splits the current sourced by M1 from node N1 into a fraction of magnitude of $2(I_{TI}-x)$, of which $I_{TI}-x$ flows through MP0 and $I_{TI}-x$ flows through MP1, and another fraction 2x flows through M3 and mirrored by M4 to M5 until flowing through MN0 and MN1.

In the bias stage 21, the current with the magnitude of $2I_{TI}$ sourced by p-channel transistor M1 is replicated to p-channel transistor M27 with a scaling factor 1/N, such that p-channel transistor M27 sources a current having a magnitude of $2I_{TI}/N$ to node E. Similarly, the control signal ntail is such that a current having a magnitude of 2x is sunk from N2, and this current is replicated to n-channel transistor M28, with a scaling factor of 1/N such that n-channel transistor M28 sinks a current having a magnitude of 2x/N from node E. Therefore, since p-channel transistor M27 sources a current having a magnitude of $2I_{TI}/N$ to node E and n-channel transistor M28 sinks a current having a magnitude of 2x/N from node E, the difference between the two currents, equal to $2I_{TI}/N-2x/N$, is forced to flow through M26, setting the voltage at node E. In addition, the current having the magnitude of 2x that is sunk from node N2 by n-channel transistor M5 is replicated to n-channel transistor M29 and scaled by a scaling factor of 1/N, such that n-channel transistor M29 sinks a current having a magnitude of 2x/N from node F. In addition, diode coupled transistor M30 sources a current having a magnitude of 2x/N to node F, setting the voltage at node F.

In the folded cascode 17, p-channel transistor M6, controlled via control signal ppol, sources a current having a magnitude of $I_{TF}$ to node A, and p-channel transistor M24, under control of the voltage at node F, mirroring the current sourced by p-channel transistor M30 to node F with a scale factor of N/2, sources a current having a magnitude of x to node A. N-channel transistor MN0 sinks a current having a magnitude of x from node A, and p-channel transistors M8 and M37, respectively controlled by the voltages at nodes pcasc and J, bring a constant current of magnitude $I_{TF}$ and source it to node N5. N-channel transistor M13, controlled via control signal ncasc, in turn sources a current having a magnitude of $I_{TF}$ to node C. P-channel transistor MP0 sources a current having a magnitude of $I_{TI}-x$ to node C. N-channel transistor M23, under control of the voltage at node E, mirroring the current sunk by n-channel transistor M26 from node E with a scale factor of N/2, sinks a current having a magnitude of $I_{TI}-x$ from node C. Therefore, n-channel transistor M14 sinks a current having a magnitude of $I_{TF}$ from node C.

Similarly, p-channel transistor M7, controlled via control signal ppol, sources a current having a magnitude of $I_{TF}$ to node B, and p-channel transistor M25, under control of the voltage at node F, mirroring the current sourced by p-channel transistor M30 to node F with a scale factor of N/2, sources a current having a magnitude of x to node B. N-channel transistor MN1 sinks a current having a magnitude of x from node B such that the current sourced by p-channel transistor M9 to node N7 has a magnitude of $I_{TF}$. The Monticelli cell 18, under control of the voltages at nodes H and J, in turn sources a current to node N6 having a magnitude of $I_{TF}$. N-channel transistor M12, controlled via control signal ncasc, in turn sources a current having a magnitude of $I_{TF}$ to node D. P-channel transistor MP1 sources a current having a magnitude of $I_{TI}-x$ to node D. N-channel transistor M22, under control of the voltage at node E, mirroring the current sunk by n-channel transistor M26 from node E with a scale factor of N/2, sinks a current having a magnitude of $I_{TI}-x$ from node D. Therefore, n-channel transistor M15 sinks a current having a magnitude of $I_{TF}$ from node D.

Consider the case of the value of VIN being 0, with the result being that x is 0. Here, a current with a magnitude of $I_{TF}$ is sourced by n-channel transistor M13 to node C. Due to the sinking of a current having a magnitude of $I_{TI}$ by n-channel transistor M23 from node C to match the sourcing of a current having a magnitude of $I_{TI}$ to node C by p-channel transistor MP0, the current sunk from node C by n-channel M14 when x is 0 has a magnitude of $I_T$ as opposed to $I_{TF}+I_{TI}$ as in the prior art design of FIG. 1. Similarly, a current with a magnitude of $I_{TF}$ is sourced by n-channel transistor M12 to node D. Due to the sinking of a current having a magnitude of $I_{TI}$ from node D by n-channel transistor M22 to match the sourcing of a current having a magnitude of $I_{TI}$ to node D by p-channel transistor MP1, the current sunk from node D by n-channel M15 when VIN is 0 has a magnitude of $I_{TF}$ as opposed to $I_F+I_{TI}$ as in the prior art design of FIG. 1. The same current balance considerations apply to nodes A and B. Here, a current with a magnitude of $I_T$ is sourced by p-channel transistor M6 to node A. Due to the sourcing of current having a magnitude equal to 0 by the p-channel transistor M24 to match the sinking of current having a magnitude of 0 by n-channel transistor MN0, the current sunk from node A by the p-channel M8 when x is 0 has a magnitude of $I_{TF}$ as in the case of the prior art design of FIG. 1. Similarly, a current with a magnitude of $I_T$ is sourced by p-channel transistor M7 to node B. Due to the sourcing of current having a magnitude equal to 0 by the p-channel transistor M25 to match the sinking of current having a magnitude of 0 by n-channel transistor MN1, the current sunk from node B by the p-channel M9 when x is 0 has a magnitude of $I_{TF}$ as in the case of the prior art design of FIG. 1.

Now consider the case of the value of VIN being VDD, with the result being that x is $I_{TI}$. Here, a current with a magnitude of $I_{TF}$ is ultimately sourced by n-channel transistor M13 to node C, a current with a magnitude of $I_{TF}$ is ultimately sourced by M12 to node D, no current is sourced by p-channel transistor MP0 to node C, no current is sourced by p-channel transistor MP1 to node D, no current is sunk by n-channel transistor M23 from node C, and no current is sunk by n-channel transistor M22 from node D. As a consequence, the current sunk from node C by n-channel transistor M14 is $I_{TF}$ and the current sunk from node D by n-channel transistor M15 is $I_{TF}$. Similarly, a current with a magnitude of $I_{TF}$ is ultimately sourced by p-channel transistor M6 to node A, a current with a magnitude of $I_{TF}$ is ultimately sourced by M7 to node B, a current of $I_{TI}$ is sourced by p-channel transistor M24 to node A, a current of $I_{TI}$ is sourced by p-channel transistor M25 to node B, a current of $I_{TI}$ is sunk by n-channel transistor MN0 from node A, and a current of $I_{TI}$ is sunk by n-channel transistor MN1 from node B. As a consequence, the current sunk from node A by p-channel transistor M8 is $I_{TF}$ and the current sunk from node B by p-channel transistor M9 is $I_{TF}$, as opposed to $I_{TF}-I_{TI}$ as in the prior art design of FIG. 1.

Figure 1:
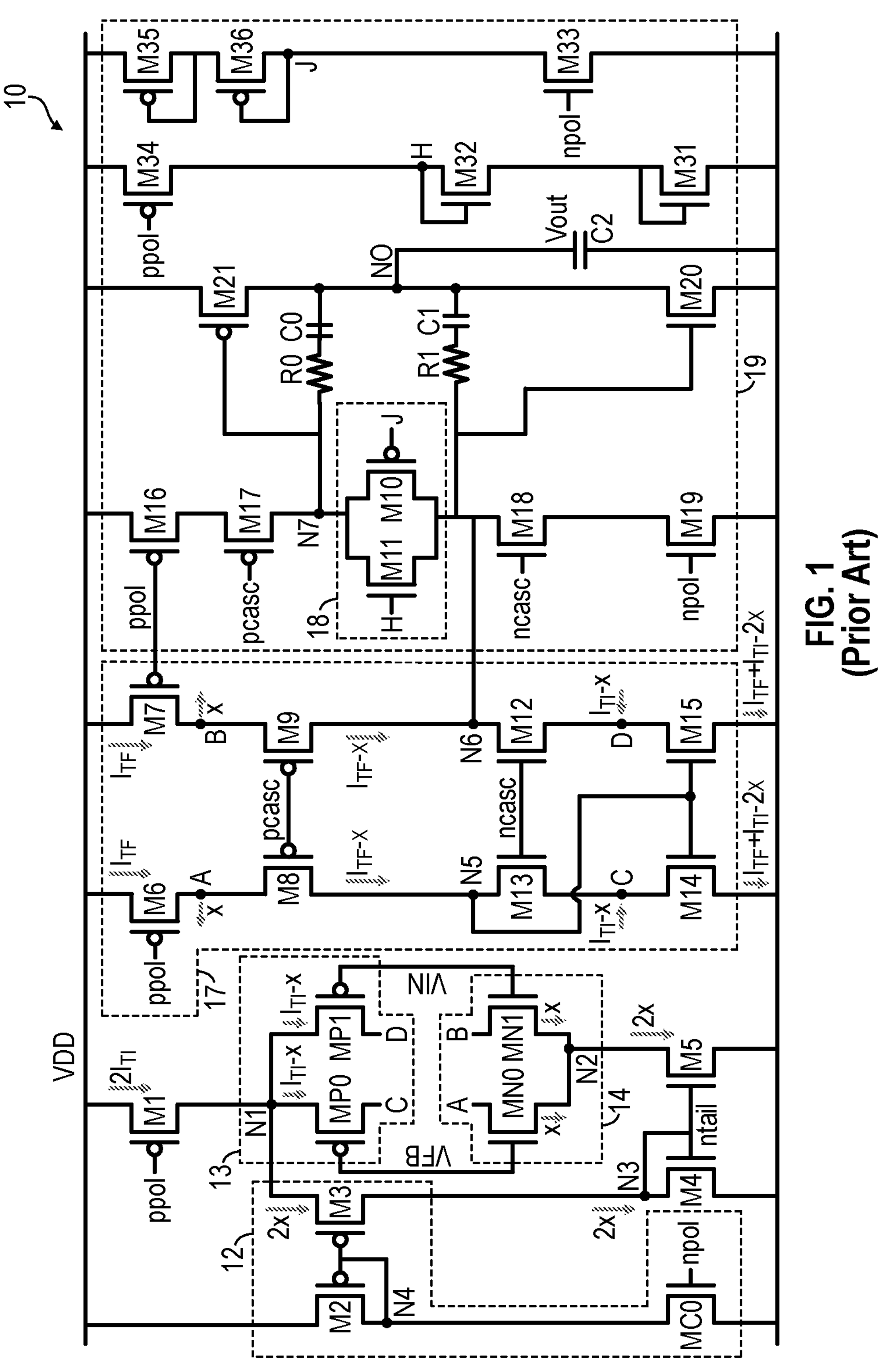
FIG. 1 is a schematic diagram of a prior art operational transconductance amplifier (OTA).

Thus, when VIN is VDD, the current sunk from node C by M14 is $I_{TF}$ and the current flowing through n-channel transistor M13 and p-channel transistor M8 is $I_{TF}$ the same as it is when VIN is 0. Likewise, when VIN is VDD, the current sunk from node D by M15 and the current flowing through n-channel transistor M12 and p-channel transistor M9 is $I_{TF}$, the same as it is when VIN is 0. Therefore, the bias current of the folded cascode 17 and the bias current of the M14:M15 mirror is input independent, as opposed to input dependent as in the prior art design of FIG. 1. The high frequency poles and zeros resulting from cascode transistors M8, M9, M13, M12, M37 and by Monticelli cell 18 do not shift with input. In addition, the transconductance of the current mirror M14:M15 is input independent, as opposed to input dependent as in the prior art design of FIG. 1. This aspect makes the input referred noise contribution of the M14:M15 mirror independent from input. Moreover, the additional branch utilized to provide constant bias currents to Monticelli cell 18 in the prior art design of FIG. 1 is now eliminated. Also, the additional current consumption of the OTA 20 given by the bias stage 21 is $2(I_{TI}+x)/N$. Since the scaling factor 1/N utilized herein may be set to a desired number, this means that N may be increased to reduce current consumption.

Figure 3:
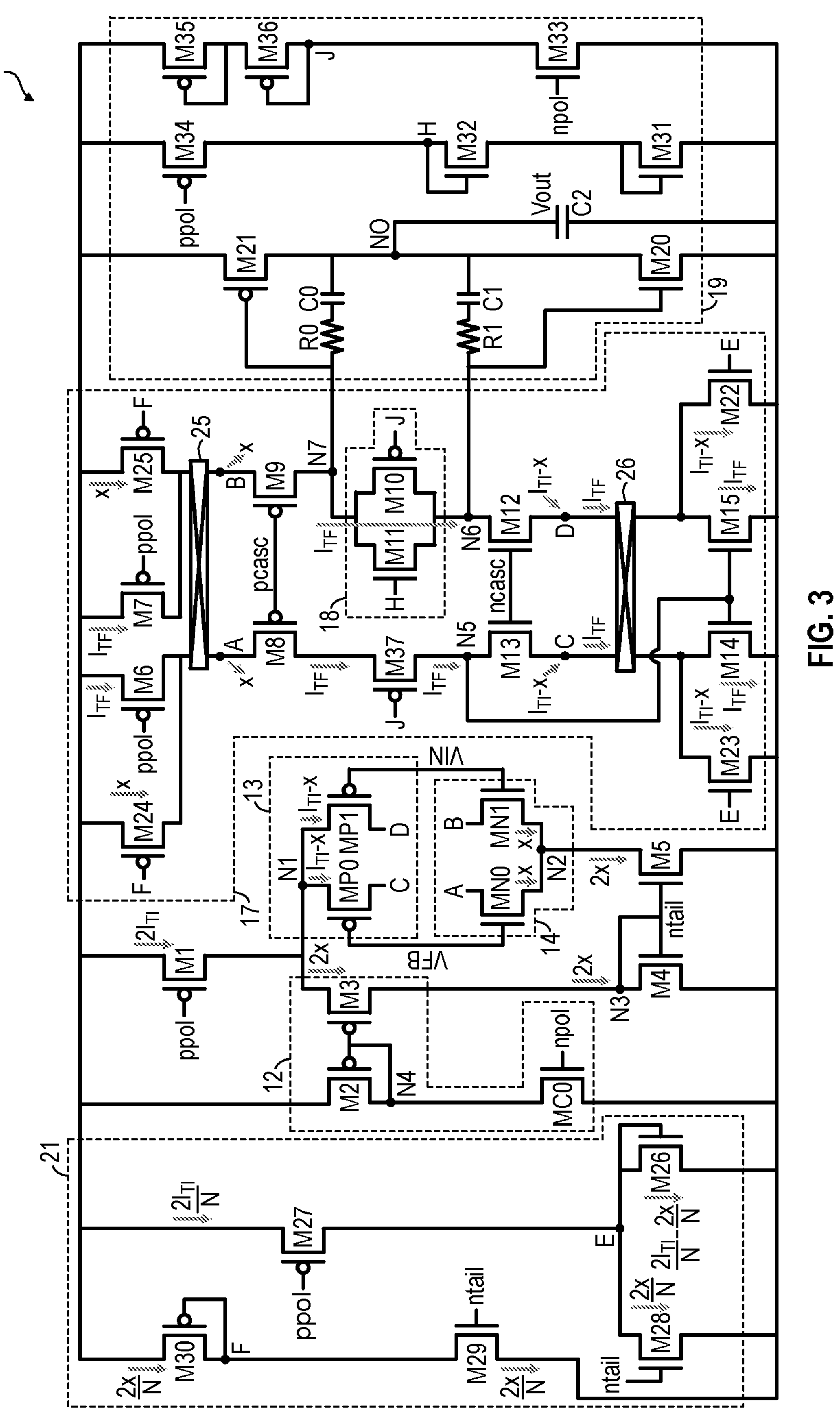
FIG. 3 is a schematic diagram of a second embodiment of an OTA disclosed herein.

Variations of the OTA 20 are within the scope of this disclosure. For example, the variant of the OTA 20' shown in FIG. 3 includes chopper 25 connected between the drains of p-channel transistors M24, M6 and node A, and between the drains of p-channel transistors M25, M7 and node B. In addition, there is a chopper 26 connected between the drain of n-channel transistor M23, M14 and node C and between the drain of n-channel transistors M15, M22 and node D. These choppers 25 and 26 serve to modulate the contribution of flicker noise and offset by transistors M24, M6, M7, M25, M23, M14, M15, and M22.

Figure 4:
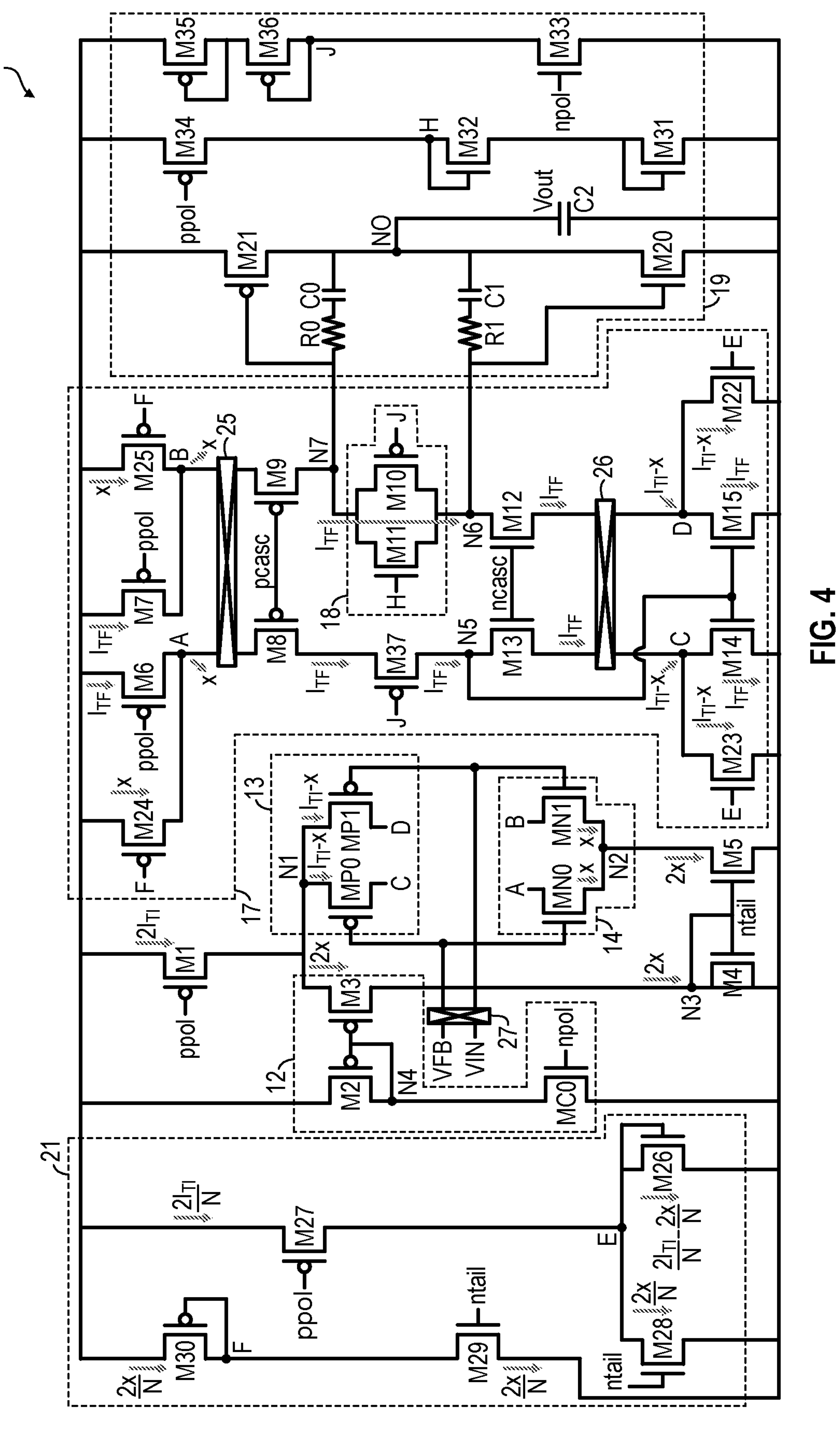
FIG. 4 is a schematic diagram of a third embodiment of an OTA disclosed herein.

Another variation is the OTA 20" shown in FIG. 4, which includes a chopper 27 that chops the feedback voltage VFB and the input voltage VIN. OTA 20" also includes chopper 25 connected between the source of p-channel transistor M8 and node A, and between the source of p-channel transistors M9 and node B. OTA 20" further includes chopper 26 connected between the source of n-channel transistor M13 and node C and between the source of n-channel transistor M12 and node D. As explained, these choppers 25 and 26 serve to modulate the contribution of flicker noise and offset by transistors MP0, MP1, MN0, MN1, M24, M6, M7, M25, M23, M14, M15, and M22.

Figure 5:
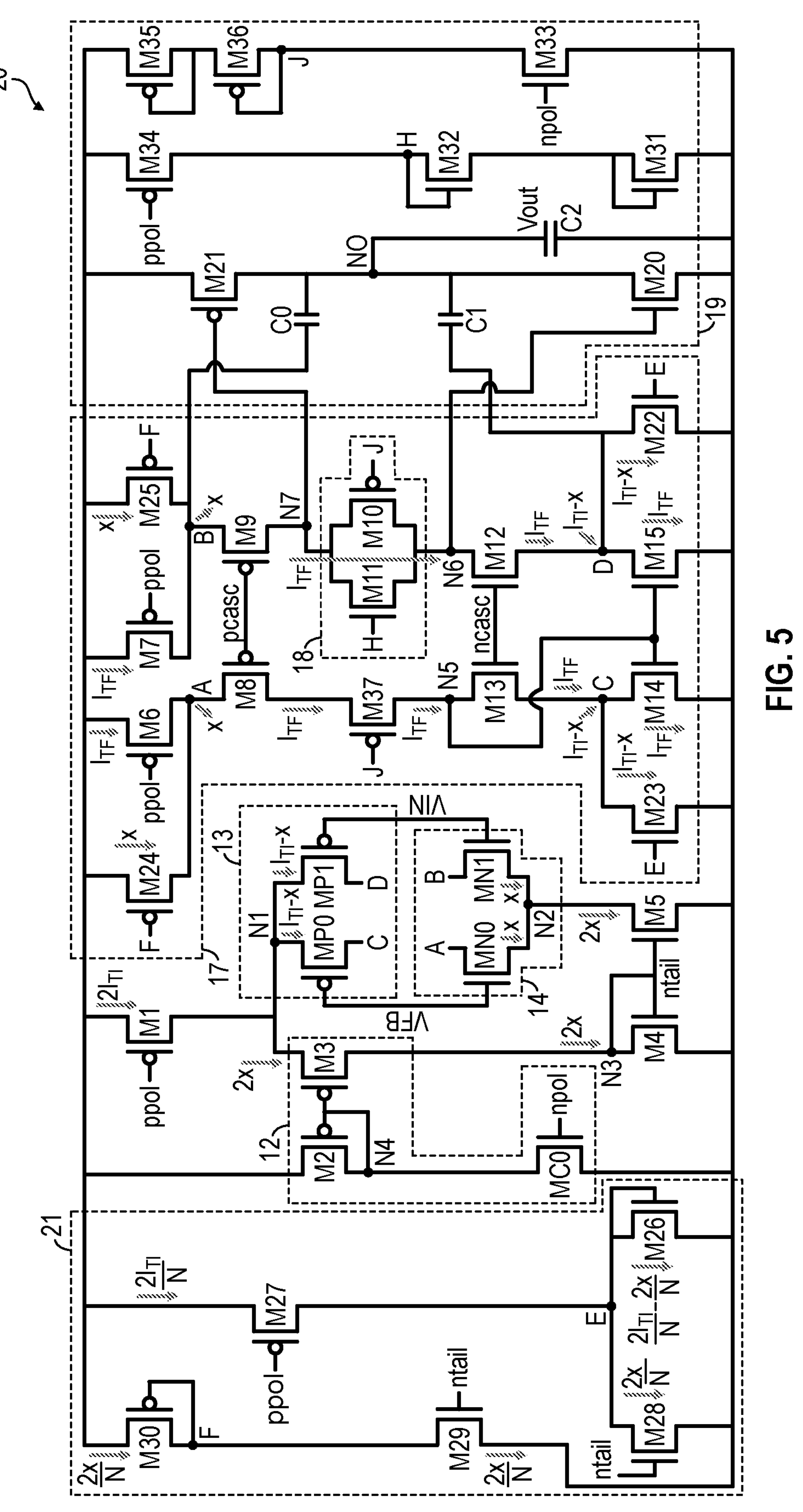
FIG. 5 is a schematic diagram of a fourth embodiment of an OTA disclosed herein.

Yet another variation is the OTA 20''' shown in FIG. 5, which removes the resistors R0 and R1, has capacitor C0 connected between node B and node N0, and has capacitor C1 connected between node D and node N0, providing compatibility with Ahuja compensation.

The OTAs 20, 20', 20", 20''' described herein may be used in a variety of applications. For example, the OTA 20 may be configured as a buffer, with the output node N0 being connected to the inverting input (gates of MP1 and MN1). Either as a buffer or as a voltage to current converter, the OTAs 20, 20', 20", 20''' described herein may be used in a variety of Micro-Electro-Mechanical Systems (MEMS) applications, particularly in applications desirous of consistent noise levels and dynamic responses across the entire spectrum of input and output dynamics. In particular, the OTAs 20, 20', 20", 20''' described herein may be used for driving the electrodes of a gyroscope resonator or a MEMS micromirror.

Finally, it is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. An operational transconductance amplifier (OTA), comprising:

- a constant current source configured to source a first constant current to a first node;
- a first input pair of transistors comprising: a first input transistor coupled between the first node and a third folded branch node, the first input transistor configured to source a first variable current to the third folded branch node based upon a feedback voltage; and a second input transistor coupled between the first node and a fourth folded branch node, the second input transistor configured to source a second variable current to the fourth folded branch node based upon an input voltage;
- a tail current source configured to sink a tail current from a second node;
- a second input pair of transistors comprising: a third input transistor coupled between a first folded branch node and the second node, the third input transistor configured to sink a third variable current from the first folded branch node based upon the feedback voltage; and a fourth input transistor coupled between a second folded branch node and the second node, the fourth input transistor configured to sink a fourth variable current from the second folded branch node based upon the input voltage;
- a folded cascode arrangement comprising: a first folded cascode branch coupled to the first folded branch node and the third folded branch node; a second folded cascode branch coupled to the second folded branch node and the fourth folded branch node; wherein the second folded cascode branch includes a Monticelli cell coupled between the second folded branch node and the fourth folded branch node;
- a class-AB output stage having inputs coupled across the Monticelli cell; and
- a bias stage configured to mirror and scale the first constant current and the tail current to produce first and second control voltages;

wherein the folded cascode arrangement includes, within the first folded cascode branch:

a first tail generator transistor controlled by the first control voltage to source a fifth variable current to the first folded branch node, the fifth variable current being equal in magnitude to the third variable current; and a second tail generator transistor controlled by the second control voltage to sink a sixth variable current from the third folded branch node, the sixth variable current being equal in magnitude to the first variable current; and wherein the folded cascode arrangement includes, within the second folded cascode branch:

a third tail generator transistor controlled by the first control voltage to source a seventh variable current to the second folded branch node, the seventh variable current being equal in magnitude to the fourth variable current; and a fourth tail generator transistor controlled by the second control voltage to sink an eighth variable current from the fourth folded branch node, the eighth variable current being equal in magnitude to the second variable current.

2. The OTA of claim 1, wherein the tail current source comprises a current mirror having a control node receiving a first control signal;

wherein the constant current source has a control terminal receiving a second control signal; and wherein the bias stage comprises:

a first bias transistor connected in a diode coupled arrangement between a supply voltage node and a first compensation node;

a second bias transistor connected between the first compensation node and ground, with a control terminal of the second bias transistor being connected to a control node of the current mirror;

a third bias transistor connected between the supply voltage node and a second compensation node, with a control terminal of the third bias transistor coupled to the second control signal;

a fourth bias transistor connected between the second compensation node and ground, with a control terminal of the fourth bias transistor coupled to the first control signal; and a fifth bias transistor connected in a diode coupled arrangement between the second compensation node and ground.

3. The OTA of claim 1, wherein the constant current source has a control terminal receiving a second control signal; and wherein the folded cascode arrangement further includes, within the first folded cascode branch:

a fifth tail generator transistor connected between a supply voltage node and the first folded branch node, the fifth tail generator transistor having a control terminal coupled to the second control signal;

a first cascode transistor connected between the first folded branch node and a third cascode transistor, the first cascode transistor having a control terminal coupled to a first cascode control signal;

a second cascode transistor connected between the first cascode transistor and a third cascode transistor, the second cascode transistor having a control terminal coupled to a third cascode control signal;

the third cascode transistor connected between the second cascode transistor and the third folded branch node, the third cascode transistor having a control terminal coupled to a second cascode control signal; and a sixth tail generator transistor connected between the third folded branch node and ground, the sixth tail generator transistor having a control terminal coupled to a node between the second cascode transistor and the third cascode transistor; and wherein the folded cascode arrangement further includes, within the second folded cascode branch:

a seventh tail generator transistor connected between the supply voltage node and the second folded branch node, the seventh tail generator transistor having a control terminal coupled to the second control signal;

a fourth cascode transistor connected between the second folded branch node and the Monticelli cell, the fourth cascode transistor having a control terminal coupled to the first cascode control signal;

a fifth cascode transistor connected between the Monticelli cell and the fourth folded branch node, the fifth cascode transistor having a control terminal coupled to the second cascode control signal; and an eighth tail generator transistor connected between the fourth folded branch node and ground, the eighth tail generator transistor having a control terminal coupled to the node between the second cascode transistor and the third cascode transistor.

4. The OTA of claim 1, wherein the first folded branch node is connected to a source of a first cascode transistor, and wherein the second folded branch node is connected to a source of a fourth cascode transistor;

wherein the folded cascode arrangement further comprises a first chopper having first and second inputs and first and second outputs, the first chopper configured to chop voltages at the first and second inputs of the first chopper, the first output of the first chopper being connected to a drain of the first cascode transistor, the second output of the first chopper being connected to a drain of the fourth cascode transistor;

wherein a fifth tail generator transistor has a first conduction terminal connected to a supply voltage node and a second conduction terminal connected to the first input of the first chopper;

wherein the first tail generator transistor has a first conduction terminal connected to the supply voltage node and a second conduction terminal connected to the first input of the first chopper;

wherein a seventh tail generator transistor has a first conduction terminal connected to the supply voltage node and a second conduction terminal connected to the second input of the first chopper; and wherein the third tail generator transistor has a first conduction terminal connected to the supply voltage node and a second conduction terminal connected to the second input of the first chopper.

5. The OTA of claim 4, wherein the third folded branch node is connected to a source of the third cascode transistor, and wherein the fourth folded branch node is connected to a source of the fifth cascode transistor;

wherein the folded cascode arrangement further includes a second chopper having first and second inputs and first and second outputs, the second chopper configured to chop voltages at the first and second inputs of the second chopper, the first output of the second chopper being connected to drains of the sixth tail generator transistor and the second tail generator transistor, the second output of the second chopper being connected to of the eighth tail generator transistor and the fourth tail generator transistor;

wherein the third cascode transistor has a first conduction terminal connected to the second cascode transistor and a second conduction terminal connected to the first input of the second chopper; and wherein the fifth cascode transistor has a first conduction terminal connected to the Monticelli cell and a second conduction terminal connected to the second input of the second chopper.

6. The OTA of claim 1, wherein the folded cascode arrangement further comprises a first chopper having first and second inputs and first and second outputs, the first chopper configured to chop voltages at the first and second inputs of the first chopper, the first output of the first chopper being connected to a drain of a first cascode transistor, the second output of the first chopper being connected to a fourth cascode transistor;

wherein a fifth tail generator transistor has a first conduction terminal connected to a supply voltage node and a second conduction terminal connected to the first input of the first chopper;

wherein the first tail generator transistor has a first conduction terminal connected to the supply voltage node and a second conduction terminal connected to the first input of the first chopper;

wherein a seventh tail generator transistor has a first conduction terminal connected to the supply voltage node and a second conduction terminal connected to the second input of the first chopper;

wherein the third tail generator transistor has a first conduction terminal connected to the supply voltage node and a second conduction terminal connected to the second input of the first chopper;

wherein the folded cascode arrangement further includes a second chopper having first and second inputs and first and second outputs, the second chopper configured to chop voltages at the first and second inputs of the second chopper, the first output of the second chopper being connected to drains of a sixth tail generator transistor and the second tail generator transistor, the second output of the second chopper being connected to drains of a eighth tail generator transistor and the fourth tail generator transistor;

wherein the third cascode transistor has a first conduction terminal connected to the second cascode transistor and a second conduction terminal connected to the first input of the second chopper;

wherein a fifth cascode transistor has a first conduction terminal connected to the Monticelli cell and a second conduction terminal connected to the second input of the second chopper; and further comprising a third chopper configured to chop the feedback voltage and the input voltage, provide the chopped feedback voltage to control terminals of the first input transistor and third input transistor, and provide the chopped input voltage to control terminals of the second input transistor and fourth input transistor.

7. The OTA of claim 1, wherein the constant current source has a control terminal receiving a second control signal; and wherein the class-AB output stage comprises:

a first input coupled to a first output terminal of the Monticelli cell;

a second input coupled to a second output terminal of the Monticelli cell;

a first output transistor connected between a supply node and an output node, the first output transistor having a control terminal connected to the first input;

a second output transistor connected between the output node and ground, the second output transistor having a control terminal connected to the second input;

a third output transistor connected between the supply node and a fourth output transistor, the third output transistor having a control terminal connected to the second control signal;

the fourth output transistor connected in a diode coupled configuration between the third output transistor and a first input of the Monticelli cell;

a fifth output transistor connected in a diode coupled configuration between the fourth output transistor and ground;

a sixth output transistor connected in a diode coupled configuration between the supply node and a seventh output transistor;

the seventh output transistor connected in a diode coupled configuration between the sixth output transistor and a second input of the Monticelli cell; and an eighth output transistor connected between the second input of the Monticelli cell and ground.

8. The OTA of claim 7, wherein the Monticelli cell comprises: a first transistor connected between the first output terminal and the second output terminal, wherein the first transistor has a control terminal connected to a control terminal of the fourth output transistor; and a second transistor connected between the first output terminal and the second output terminal, wherein the second transistor has a control terminal connected to a control terminal of the seventh output transistor.

9. The OTA of claim 7, wherein the class-AB output stage comprises: a first resistor and first capacitor connected in series between the first output terminal of the Monticelli cell and the output node; and a second resistor and second capacitor connected in series between the second output terminal of the Monticelli cell and the output node.

10. The OTA of claim 7, wherein the class-AB output stage comprises: a first capacitor connected in series between the second folded branch node and the output node; and a second capacitor connected in series between the fourth folded branch node and the output node.

11. An operational transconductance amplifier (OTA), comprising:

a constant current source p-channel transistor having a source connected to a supply voltage node, a drain connected to a first node, and a gate coupled to a first control voltage;

a first input pair of transistors comprising:

a first input p-channel transistor having a source connected to the first node, a drain connected to a third folded branch node, and a drain coupled to a feedback voltage; and a second input p-channel transistor having a source connected to the first node, a drain connected to a fourth folded branch node, and a drain coupled to an input voltage;

a tail current source n-channel transistor having a drain connected to a second node, a source connected to ground, and a gate connected to a third node;

a second input pair of transistors comprising:

a first input n-channel transistor having a drain connected to a first folded branch node, a source connected to the second node, and a gate coupled to the feedback voltage; and a second input n-channel transistor having a drain connected to a second folded branch node, a source connected to the second node, and a gate coupled to the input voltage;

a first mirror n-channel transistor having a drain and a gate connected to the third node, and a source connected to ground;

a second mirror p-channel transistor having a source connected to the first node, a drain connected to the third node, and a gate connected to a fourth node;

a third mirror p-channel transistor having a source connected to the supply voltage node, and a drain and a gate connected to the fourth node;

a tail n-channel transistor having a drain connected to the fourth node, a source connected to ground, and a gate coupled to a second control voltage;

a bias stage comprising:

a first bias p-channel transistor having a source connected to the supply voltage node, a drain connected to a first bias node, and a gate coupled to the first control voltage;

a first bias n-channel transistor having a drain connected to the first bias node, a source connected to ground, and a gate coupled to the first bias node;

a second bias n-channel transistor having a drain connected to the first bias node, a source connected to ground, and a gate coupled to the second control voltage;

a second bias p-channel transistor having a source connected to the supply voltage node, and a drain and gate connected to a second bias node; and a third bias n-channel transistor having a drain connected to the second bias node, a source connected to ground, and a gate coupled to the third node;

a folded cascode arrangement comprising, within a first folded cascode branch:

a first tail generator p-channel transistor having a source connected to the supply voltage node, a drain connected to the first folded branch node, and a gate connected to the second bias node; and a first tail generator n-channel transistor having a drain connected to the third folded branch node, a source connected to ground, and a gate connected to the first bias node;

the folded cascode arrangement comprising, within a second folded cascode branch:

a second tail generator p-channel transistor having a source connected to the supply voltage node, a drain connected to the second folded branch node, and a gate connected to the first bias node;

a second tail generator n-channel transistor having a drain connected to the fourth folded branch node, a source connected to ground, and a gate connected to the first bias node; and a Monticelli cell coupled between the drain of the second tail generator p-channel transistor and the drain of the second tail generator n-channel transistor; and a class-AB output stage having inputs coupled across the Monticelli cell and an output connected to an output node.

12. The OTA of claim 11, wherein the folded cascode arrangement further comprises, within the first folded cascode branch:

a third tail generator p-channel transistor having a source connected to the supply voltage node, a drain connected to the first folded branch node, and a gate coupled to the first control voltage;

a first cascode p-channel transistor having a source connected to the first folded branch node, a drain, and a gate coupled to a first cascode control signal;

a second cascode p-channel transistor having a source connected to the drain of the first cascode p-channel transistor, a drain, and a gate connected to a first cascode control node;

a first cascode n-channel transistor having a drain connected to the drain of the second cascode p-channel transistor, a source connected to the third folded branch node, and a gate coupled to a second cascode control signal; and a second cascode n-channel transistor having a drain connected to the third folded branch node, a source connected to ground, and a gate connected to the drain of the second cascode p-channel transistor.

13. The OTA of claim 12, wherein the folded cascode arrangement further comprises, within the second folded cascode branch:

a third cascode p-channel transistor having a source connected to the supply voltage node, a drain connected to the second folded branch node, and a gate coupled to the first control voltage;

a fourth cascode p-channel transistor having a source connected to the second folded branch node, a drain, and a gate coupled to the first cascode control signal;

a third cascode n-channel transistor having a drain, a source connected to the fourth folded branch node, and a gate coupled to the second cascode control signal;

a fourth cascode n-channel transistor having a drain connected to the fourth folding branch node, a source connected to ground, and a gate connected to the drain of the second cascode p-channel transistor; and the Monticelli cell having a first output connected to the drain of the fourth cascode p-channel transistor, a second output connected to the drain of the second cascode n-channel transistor, a first input connected to the first cascode control node, and a second input connected a second cascode control node.

14. The OTA of claim 13, further comprising:

a first chopper having a first input connected to the drain of the third tail generator p-channel transistor, a second input connected to the drain of the first tail generator p-channel transistor, a first output connected to the first folded branch node, and a second output connected to the second folded branch node; and a second chopper having a first input connected to the source of the first cascode n-channel transistor, a second input connected to the source of the third cascode n-channel transistor, a first output connected to the third folded branch node, and a second output connected to the fourth folded branch node.

15. The OTA of claim 14, further comprising a third chopper configured to chop the feedback voltage and the input voltage.

16. The OTA of claim 11, wherein the class-AB output stage comprises:

a first input node connected to a first output of the Monticelli cell;

a second input node connected to a second output of the Monticelli cell;

a first output p-channel transistor having a source connected to the supply voltage node, a drain connected to an output node, and a gate connected to the first input node;

a first output n-channel transistor having a drain connected to the output node, a source connected to ground, and a gate connected to the second input node;

a second output p-channel transistor having a source connected to the supply voltage node, a drain connected to a second cascode control node, and a gate coupled to the first control voltage;

a second output n-channel transistor having a drain and gate connected to the second cascode control node, and a source;

a third output n-channel transistor having a drain and a gate connected to the source of the second output n-channel transistor, and a source connected to ground;

a third output p-channel transistor having a source connected to the supply voltage node, and a gate and drain;

a fourth output p-channel transistor having a source connected to the gate and drain of the third output p-channel transistor, and a gate and drain connected to the first cascode control node; and a fourth output n-channel transistor having a drain connected to the first cascode control node, a source connected to ground, and a gate coupled to the second control voltage.

17. The OTA of claim 16, wherein the class-AB output stage further comprises: a first resistor and first capacitor connected in series between the first output of the Monticelli cell and the output node; and a second resistor and second capacitor connected in series between the second output of the Monticelli cell and the output node.

18. The OTA of claim 16, wherein the class-AB output stage further comprises: a first capacitor connected in series between the second folded branch node and the output node; and a second capacitor connected in series between the fourth folded branch node and the output node.

* * * * *